(12) United States Patent
Chen

(10) Patent No.: US 6,376,283 B1
(45) Date of Patent: Apr. 23, 2002

(54) MONO-CHIP MULTIMEDIACARD FABRICATION METHOD

(75) Inventor: Jerry Chen, Taipei Hsien (TW)

(73) Assignee: Power Digital Card Co., Ltd. (TW)

( * ) Notice: Subject to any disclaimer, the term of this patent is extended or adjusted under 35 U.S.C. 154(b) by 0 days.

(21) Appl. No.: 09/552,588

(22) Filed: Apr. 19, 2000

(51) Int. Cl.[7] .......................... H01L 21/48; H01L 21/50; H01L 21/44; H01R 12/00; H05K 1/00

(52) U.S. Cl. ...................... 438/124; 438/127; 438/118; 439/76.1

(58) Field of Search ................................. 438/124, 106, 438/121, 127, 118; 174/52.2; 439/76.1, 55

(56) References Cited

U.S. PATENT DOCUMENTS

| | | | | |
|---|---|---|---|---|
| 5,138,430 A | * | 8/1992 | Gow et al. ..................... 357/70 |
| 5,147,982 A | * | 9/1992 | Steffen ....................... 174/52.2 |
| 5,200,362 A | * | 4/1993 | Lin et al. ...................... 437/207 |
| 5,677,511 A | * | 10/1997 | Taylor et al. ............... 174/52.2 |
| 5,846,092 A | * | 12/1998 | Feldman et al. ........... 439/76.1 |
| 5,861,662 A | * | 1/1999 | Candelore ................... 257/679 |

FOREIGN PATENT DOCUMENTS

DE     19728693 A1  *  1/1999   ........... H01L/23/12

OTHER PUBLICATIONS

Chan, World's Smallest Solid State Storage Device Sets New Industry Standard, 1997, IEEE.*

* cited by examiner

Primary Examiner—Richard Elms
Assistant Examiner—Adam Pyonin
(74) Attorney, Agent, or Firm—Donald C. Casey, Esq.

(57) ABSTRACT

A MultiMediaCard fabrication method includes the steps of (1) conductive bracket preparation, (2) bending front legs of the conductive bracket into shape, (3) injection shell, (4) die bond, (5) wire bond, (6) glob top, (7) printing the desired logo and design on the shell of the semi-finished product thus obtained from step (6).

1 Claim, 2 Drawing Sheets

MONO-CHIP MULTIMEDIACARD FABRICATION METHOD

BACKGROUND OF THE INVENTION

The present invention relates a mono-chip MultiMediaCard fabrication method, and more particularly to such a mono-chip MultiMediaCard fabrication method, which greatly reduces MultiMediaCard manufacturing cost, and improves the product quality.

Following fast development of electronic integrated circuit technology and materials, chips are made having better function and smaller size for use in a variety of electronic goods including electronic dictionary, digital camera, and etc. The application of electronic integrated circuits enables electronic products to be made smaller than ever. Nowadays various MultiMediaCards have been disclosed for use with multimedia apparatus that combines audio and video components to create an interactive application that uses text, sound, and graphics. FIG. 1 shows a mono-chip MultiMediaCard fabrication method according to the prior art. This method comprises the steps of (1) PVC (polyvinyl chloride) or ABS (acrylonitrile-butadiene-styrene) card body preparation, (2) card body milling to form a hole on the card body, (3) thin tape preparation, (4) die bond, (5) wire bond, (6) glob top, (7) joining the card body obtained from step (2) and the die obtained from step (6) with a cold glue or thermofusing glue, (7) printing. This monochip MultiMediaCard fabrication method has drawbacks as outlined hereinafter.

1. Low fabrication speed: Because the card body and the die are separately fabricated and then fastened together, the fabrication procedure cannot be continuously performed in series.
2. High manufacturing cost: After preparation of the card body, the card body must be processed through a milling process to form a hole for receiving the die, and then the card body and the prepared die are sealed by means of a cold glue or thermofusing glue. This complicated fabricating procedure greatly increases the manufacturing cost of MultiMediaCards.
3. Short service life: Because the thin tape is not wear resistant, it wears quickly with use.

SUMMARY OF THE INVENTION

The present invention has been accomplished to provide a MultiMediaCard fabrication method, which eliminates the aforesaid drawbacks. It is one object of the present invention to provide a mono-chip MultiMediaCard fabrication method, which is practical for rapid and mass production. It is another object of the present invention to provide a mono-chip MultiMediaCard fabrication method, which greatly reduces the manufacturing cost of MultiMediaCards. It is still another object of the present invention to provide a mono-chip MultiMediaCard fabrication method, which greatly improves the quality and service life of MultiMediaCards. It is still another object of the present invention to provide a mono-chip MultiMediaCard fabrication method, which greatly reduces the chance of fabrication failure. It is still another object of the present invention provide a mono-chip MultiMediaCard fabrication method, which greatly improves the outer appearance of MultiMediaCards. According to the present invention, the MultiMediaCard fabrication method comprises the steps of (1) conductive bracket preparation, (2) bending front legs of the conductive bracket into shape, (3) injection shell, (4) die bond, (5) wire bond, (6) glob top, (7) printing the desired logo and design on the shell of the semi-finished product thus obtained from step (6).

DETAILED DESCRIPTION OF THE PREFERRED EMBODIMENT

Figure 1:
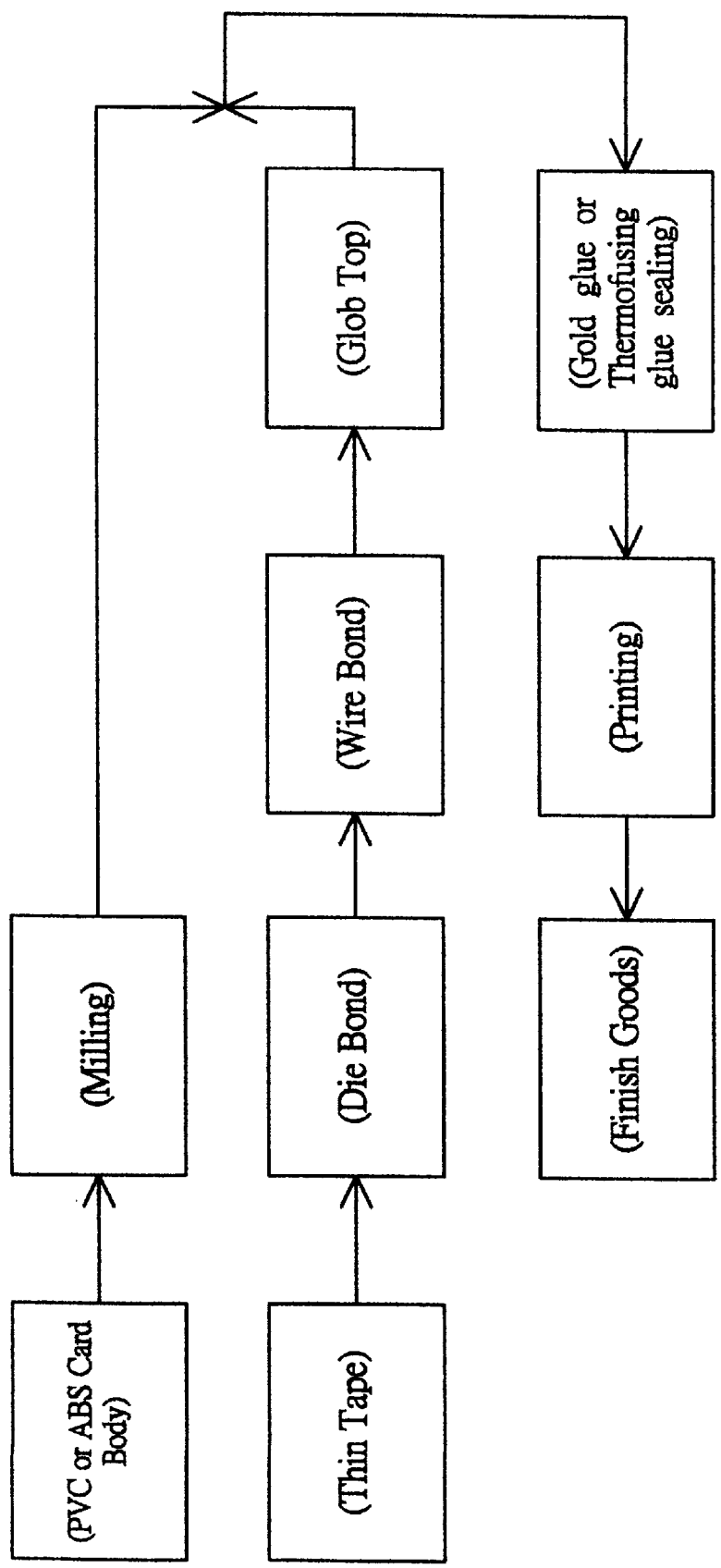
FIG. 1 is a flow chart explaining a mono-chip multi-chip MultiMediaCard fabrication method according to the prior art.
Figure 2:
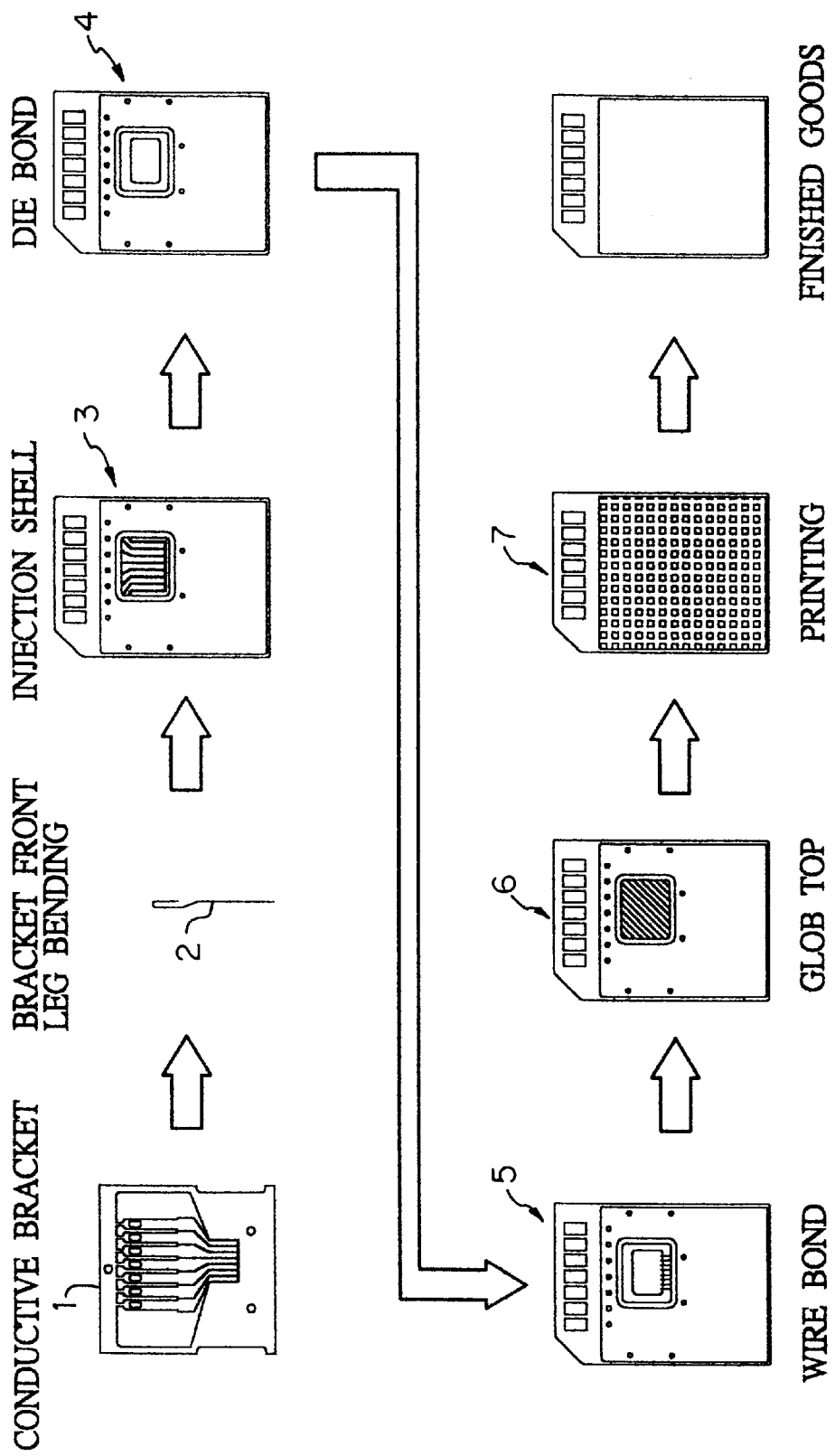
FIG. 2 is a flow chart explaining a mono-chip multi-chip MultiMediaCard fabrication method according to the present invention.

Referring to FIG. 2, a mono-chip multi-chip MMCard (MultiMediaCard) fabrication method in accordance with the present invention comprises the steps of:

1). Preparing a conductive bracket, which is preferably made of copper for the advantage of high wear resistant property;
2). Bending front legs of the conductive bracket into shape to serve as external contacts of the MMCard;
3). Sending the conductive bracket with an injection molding material into an injection molding machine for injection molding into a card having an open space corresponding to the conductive bracket;
4). Inserting a prepared chip into the open space on the card, and bonding the chip to the conductive bracket;
5). Bonding gold wires or aluminum wires to the shaped front legs of the conductive bracket at the card;
6). Encapsulating the gold or aluminum wire-bonded card with an encapsulating material, so as to form a semi-finished product;
7). Printing the desired logo and design on the shell of the semi-finished product, and finished goods is thus obtained.

As indicated above, the present invention provides a MultiMediaCard fabrication method, which enables the designed MultiMediaCard to be efficiently manufactured at low cost.

What the invention claimed is:

1. A MultiMediaCard fabrication method comprising the steps of:

providing a conductive bracket having integral front legs;

bending the front legs of said conductive bracket to form external contacts;

injection molding said conductive bracket into a card having an open space corresponding to said conductive bracket;

inserting a prepared chip into the open space on said card, and bonding the chip to said conductive basket;

bonding electrically conductive wires to said external contacts of said conductive bracket at said card;

subsequently said card with an encapsulating material, so as to form a semi-finished product;

printing a logo and design on said semi-finished product.

* * * * *